United States Patent
Furukawa et al.

[11] Patent Number: 6,150,256
[45] Date of Patent: Nov. 21, 2000

[54] METHOD FOR FORMING SELF-ALIGNED FEATURES

[75] Inventors: Toshiharu Furukawa, Essex Junction; Mark C. Hakey; Steven J. Holmes, both of Milton; David V. Horak, Essex Junction; Paul A. Rabidoux, Winooski, all of Vt.

[73] Assignee: International Business Machines Corporation, Armonk, N.Y.

[21] Appl. No.: 09/183,338

[22] Filed: Oct. 30, 1998

[51] Int. Cl.[7] .................................................. H01L 21/4763
[52] U.S. Cl. .......................... 438/618; 438/637; 438/736; 430/312
[58] Field of Search ..................................... 430/312, 314, 430/323; 438/618, 736, FOR 118, FOR 133, FOR 355, 637, 671

[56] References Cited

U.S. PATENT DOCUMENTS

| | | |
|---|---|---|
| 4,280,854 | 7/1981 | Shibata et al. . |
| 4,761,464 | 8/1988 | Zeigler . |
| 5,173,442 | 12/1992 | Carey . |
| 5,185,294 | 2/1993 | Lam et al. . |
| 5,306,390 | 4/1994 | Peek . |
| 5,776,660 | 7/1998 | Hakey et al. . |

OTHER PUBLICATIONS

Timothy W. Weidman and Ajey M. Joshi, "New Photodefinable Glass Etch Masks For Entirely Dry Photolighogroahy: Plasma Deposited Organosilicon Hydride Polymers", Appl. Phys, Lett. 62(4), Jan. 25, 1993.

R.L. Kostelak, T.W. Weidman, and S. Vaidya, "Application of Plasma Polymerized Methylsilane Resist For All–Dry 193 nm Deep Ultraviolet Processing", J. Vac. Sci. Technol. B 13(6), Nov./Dec. 1995.

Derwent World Patten Index, "Japanese Patent No. 2010535 Abstract", Jan. 16, 1990.

Primary Examiner—George Fourson
Attorney, Agent, or Firm—Schmeiser, Olsen & Watts; Eugene I. Shkurko

[57] ABSTRACT

The present invention provides for an improved method of creating vias and trenches during microchip fabrication. According to the invention, the vias and trenches are self-aligned during the photolithography process by using two layers of specially selected resists and exposing the resists such that the lower resist is exposed only where an opening has been formed in the upper resist layer. This self-aligning enables the vias to be printed as elongated shapes, which allows for the use of particularly effective image enhancement techniques. The invention further provides a simplified procedure for creating vias and trenches, in that only one etch step is required to simultaneously create both vias and trenches. An alternative embodiment of the invention allows looped or linked images, such as those printed using image enhancement techniques, to be trimmed to form isolated features.

53 Claims, 9 Drawing Sheets

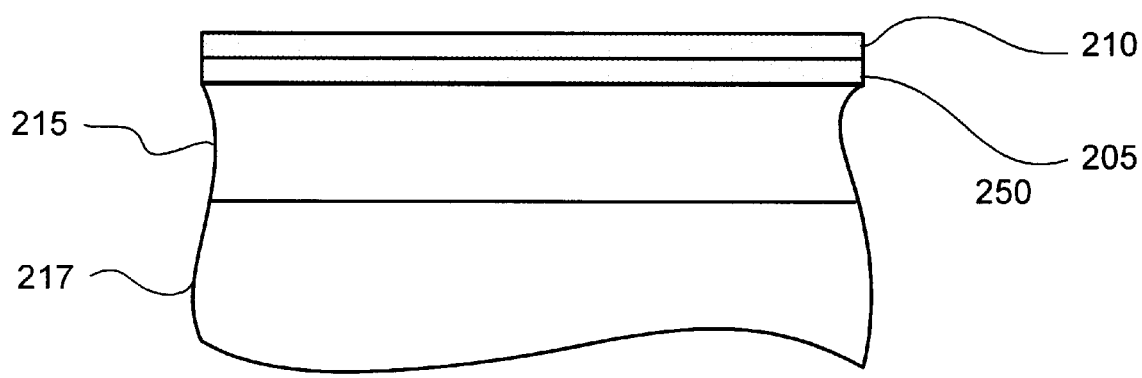
FIG. 2

METHOD FOR FORMING SELF-ALIGNED FEATURES

BACKGROUND

I. Technical Field

This invention relates, in general, to the design and production of semiconducting microchips. More particularly, this invention relates to methods for establishing electrical contacts between components of a semiconducting microchip.

II. Background Art

The semiconductor microchip has become a ubiquitous part of everyday life. Microchips are obviously found in computers, but are also found in everything from garage door openers to cars to children's toys. The microchip has become a vital and important part of everyday life for virtually every person in the United States, and most people around the world.

Microchips are constructed from silicon or other semiconductors. By selectively introducing impurities into particular regions of the silicon and by selectively depositing and removing other materials onto the silicon, circuits may be constructed on a silicon chip. A chip is built using a process known as "photolithography". Photolithography consists of placing chemicals upon the surface of the chip and exposing that surface to radiation, typically light of a carefully selected wavelength, to selectively cause chemical reactions at particular locations on the chip's surface. Special compounds called "photoresists" or simply "resists" have been created for this purpose. Different resists have different chemical and physical properties and respond to different wavelengths of light. The location of the chemical reactions is controlled by "masking" the surface of a chip so that only certain portions of it receive radiation. The results of these chemical reactions allow certain parts of the surface of the chip to be removed or modified. By sequentially applying these processes a layer of electrically connected devices, such as transistors and capacitors can be formed.

A single layer of a chip may be electrically connected in a variety of ways. One method of electrically connecting a chip layer is to use the selective deposition and removal of a metal to create lines of metal on the surface of a chip to connect circuit components. According to this process, a thin metallic film, typically aluminum, is deposited over the surface of a chip. A layer of resist is then applied over the surface of the film. The resist is next exposed to light of an appropriate wavelength using a mask that exposes a pattern of relatively narrow lines on the resist. The resist is then developed and etched, leaving aluminum in the pattern exposed on the resist. This pattern of aluminum forms the electrical connections for that layer of the chip.

A newer method of electrically connecting one layer of a chip is known as the "damascene" process. According to the damascene process, a silicon dioxide layer is grown over the surface of a chip. A layer of resist is applied to the silicon dioxide layer. The resist is then exposed to establish the appropriate pattern of interconnections. The resist is then developed and an etch is performed. This etch produces trenches in the silicon dioxide patterned to form the interconnections for that layer. A metal, typically aluminum, copper or tungsten, is next deposited over the surface of the chip, filling the trenches. The metal is then planarized so that it is removed from the surface of the chip except where it filled in the trenches. As a result, metal fills the trenches to form a pattern of interconnections. Horizontal connections, are generally referred to as "wires". A typical chip includes one layer of devices and multiple layers of wiring connected to those devices.

While a microchip may consist of a single layer of wiring, as a practical matter several layers are required to obtain sufficient chip function in today's technologically advanced world. The layers of the microchip are typically separated by silicon dioxide or another dielectric to prevent one layer of a chip from interfering with the operation of another layer. However, these layers of a chip must be electrically connected at the appropriate locations through the silicon dioxide. Otherwise, each individual layer would exist in isolation from the other layers, and the chip could not perform properly.

To connect layers of a chip, the silicon dioxide that separates wiring layers must be penetrated and the components of the layers electrically connected in an appropriate manner. One common way to electrically connect the layers of a chip is the "dual damascene" method. This method is known as dual damascene because it is similar to the damascene process that was described above for use in creating wiring to electrically connect components on one layer of a chip. The first step is to create trenches in the silicon dioxide for wires as described above. The second step is to create openings through the silicon dioxide to the lower chip layer. The openings are made using a process of applying a resist, masking, exposing, developing, and etching, as was set forth above. The openings through a layer of silicon dioxide are commonly referred to as "vias". A via is typically formed using a square mask image which, due to diffraction effects, prints a circle on the photoresist. A square mask image, such as is used to print a via, is not suitable for most image enhancement techniques that are used in photolithography, as those techniques require elongated images to function most effectively. After developing the resist and etching the silicon dioxide, a conductor, typically aluminum, copper or tungsten, is deposited over the surface of the chip, thus filling the vias and the trenches. The conductor in the vias forms vertical structures referred to as "studs" or "interconnects" that extend through the silicon dioxide to electrically connect the components above the silicon dioxide to the components below the silicon dioxide. For an interconnect to function properly, it must make an adequate contact with the appropriate circuit element on each layer it is to connect. Typically, a via must be created through the silicon dioxide to extend between two trenches on adjacent layers.

The dual damascene method of electrically connecting layers of a microchip requires a careful alignment of vias and trenches. The tolerances that must be allowed to assure a proper alignment of vias and trenches limits the density that may be obtained on a microchip. The conventional method of fabricating vias and trenches is to first create the trenches and then create the vias, as separate steps in the fabrication process. Each step necessarily requires the substeps of applying resist, masking and exposing the surface, developing the resist, and then etching the surface.

The need exists for a new process to allow for improved alignment of vias and trenches so that space on a chip may be used more advantageously. An improved method should allow conventional image enhancement techniques to be applied to the printing of vias, while still creating a compact, non-elongated via on the chip. The need also exists for a new process requiring fewer processing steps in creating vias and trenches, to simplify chip fabrication and to reduce fabrication costs.

DISCLOSURE OF THE INVENTION

The present invention overcomes the difficulties found in the background art by providing a method for creating self-aligned vias and trenches. The present invention creates self-aligning vias and trenches by using two layers of resist, one of which masks the underlying layer such that a via may be printed only where a trench has been printed.

The vias and trenches are self-aligned by using two specially selected resists layered on top of one other. The lower resist layer (which is used to pattern the vias) is only exposed where the upper resist layer (which is used to pattern the trenches) is also exposed. As a result, vias may only be created where a trench is to be created. Because the vias and trenches are self-aligned, the wires and the studs are also self-aligned. Because the vias and trenches are self-aligning, a lesser margin of error is required to successfully intersect a via with a trench. This enables denser and more efficient chip designs to be created. The self-aligning attribute allows the use of elongated images in the creation of vias, enabling the use of image enhancement techniques in printing vias. The present invention also provides a more efficient procedure for chip fabrication, as it requires only a single etch step to create both vias and trenches simultaneously.

The present invention allows for increased density by allowing for the use of more effective image enhancement techniques, such as alternating phase shift reticles and off-axis illumination, to reduce the separation between adjacent trenches without risking fails due to shorts between wires and contacts. The present invention also achieves greater density by allowing for the use of image enhancement techniques in the formation of the via pattern. Vias have typically been printed as isolated square shapes, which are not amenable to the application of image enhancement techniques. In accordance with the present invention, the vias may be printed as elongated patterns that may be enhanced using phase shift, hybrid resist, and/or off-axis illumination techniques.

The present invention overcomes density limitations due to concerns over shorting because the interconnect is self-aligned to the wire. Thus, the separation between wires may be reduced. The present invention also avoids the formation of open circuits or reduced contact area due to the misalignment of a via and a trench because, again, the via and the trench are self-aligned.

BRIEF DESCRIPTION OF THE DRAWINGS

FIG. 2 is a cross-sectional view of a substrate being processed in accordance with the preferred embodiment;

BEST MODE FOR CARRYING OUT THE INVENTION

Figure 1:
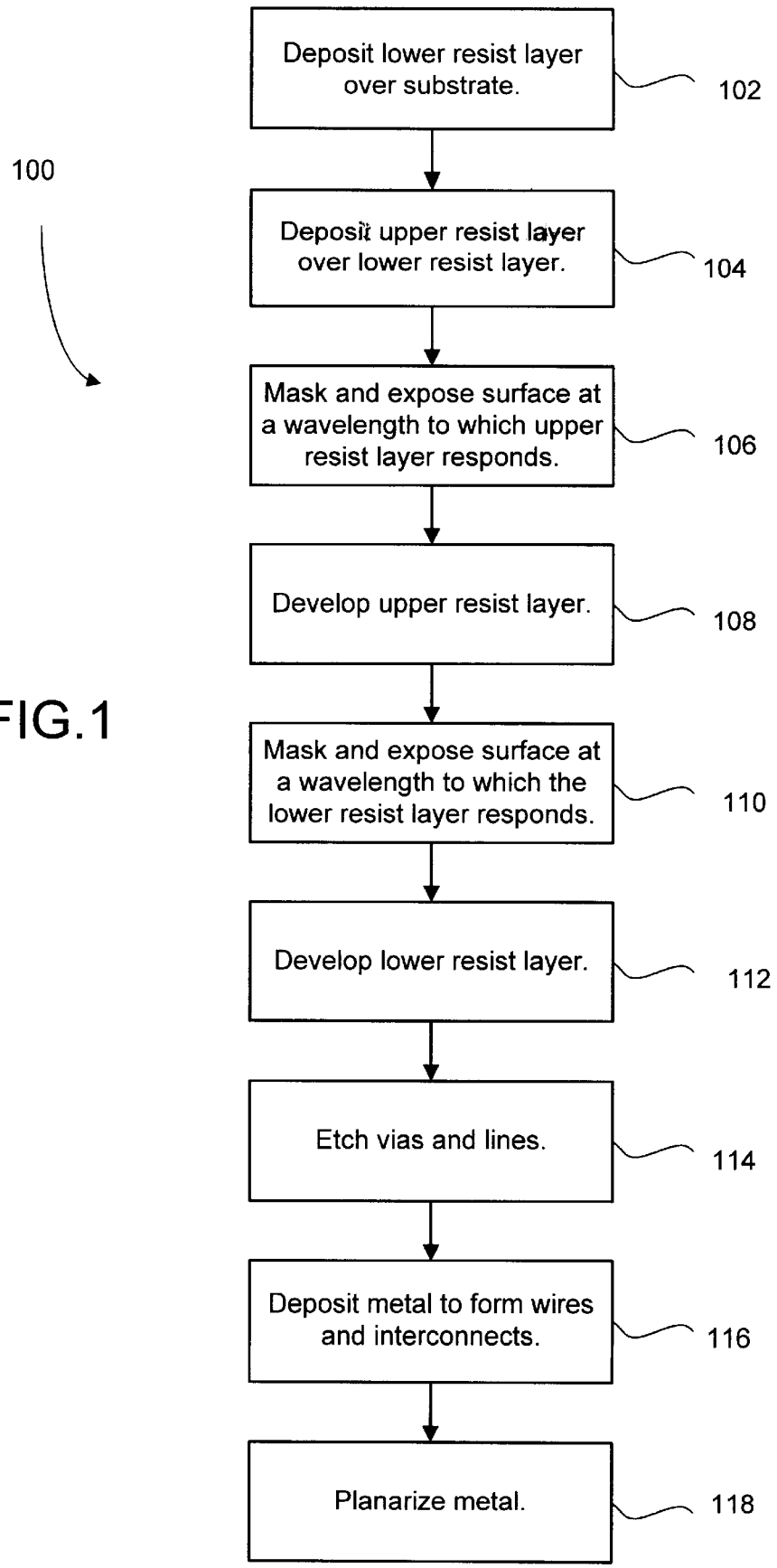
FIG. 1 is a method in accordance with the preferred embodiment.

The present invention provides for an improved method of creating vias and trenches during microchip fabrication. According to the invention, the vias and trenches are self-aligned during the photolithography process by using two layers of specially selected resists and exposing the resists at differing wavelengths. This self-aligning enables the vias to be printed as elongated shapes, which allows for the use of particularly effective image enhancement techniques. The invention further provides a simplified procedure for creating vias and trenches, in that only one etch step is required to simultaneously create both vias and trenches.

The conventional method of creating intersecting vias and lines needlessly consumes space on the chip and can sacrifice the chip's performance. Also, the photolithographic processes used to create vias according to the standard fabrication processes face grave limitations as the dimensions of microchip circuit components continue to shrink. In the Rayleigh model, $$resolution = K*(exposurewavelength)/(nuimericalapertureofexposuretool)$$

a smaller value for K provides higher resolution. K is dependent upon the quality of the optics and the type of process being used to pattern the image. As the dimensions of circuit components, such as vias, have diminished, the limits of the photolithographic processes have been pushed.

The limits of photolithographic processes have been extended using image enhancement techniques. As will be recalled, vias are typically printed using square mask images which print as circles on the photoresist. The aerial images for vias are typically enhanced using rim-shift phase shift reticles or using attenuated phase shift reticles. While these techniques provide some enhancement of the aerial image of the via, they are not as effective as alternating (Levenson) phase shift reticles or off-axis illumination methods. Alternating phase shift methods provide a capability to print images at 0.35 Rayleigh K factor values, whereas conventional lithography is limited to operation at about 0.6 K factor values, and rim shift or attenuated phase masks operate at about 0.5 K values. Off-axis illumination can provide some enhancement of nested line/space patterns, but provides little enhancement to isolated patterns, such as the images conventionally used to print vias. Off-axis illumination used in conjunction with attenuated phase masks can provide access to K values between 0.40 and 0.45. Edge printing methods, such as sidewall image transfer or hybrid resist, can also provide operation at 0.35 K values, but they do not function for vias. As is apparent from the above, compact shapes, such as those used in printing vias, are helped little by conventional image enhancement techniques. Thus, the printing of vias has become a serious obstacle to the continued miniaturization of microchip circuitry.

In accordance with conventional processes, to assure proper contact between interconnects and wires, the vias and trenches must be created with a considerable margin for error. In many chip designs, the vias and lines are designed to be approximately the same width. To assure a proper intersection, the overlay budget is about forty percent of the image size. Thus, for a 0.20 micron via and an intersecting trench of 0.20 microns, an overlay tolerance of plus or minus 0.08 microns is required. The image size tolerance is usually about twenty percent of the image size, which would be plus or minus 0.04 microns in the present example. If the image for the line is in the extreme range of 0.16 microns, the image size of the via is likewise in the extreme range of 0.16 microns, and the overlay is at the extreme of 0.08, there must still be sufficient overlap for the device to function, in this example an overlap of 0.08 microns. If the overlap is inadequate, the circuit will not function properly. For example, the circuit may be "open" where the connection was to be.

Similarly, the need to prevent shorting between adjacent wires also limits the density presently attainable on a microchip. When the via is large, to continue the above example 0.24 microns, and the overlay is, say, 0.08 microns, and the wire is at the largest allowable image size of 0.24 microns, the tolerance deviations total 0.16 microns. In this example, the wire separation may be set at 0.20 microns so that no shorting will occur. This separation limits the density attainable on a chip.

Referring now to FIG. 1, a flow diagram illustrating a method 100 in accordance with the preferred embodiment is shown. The first step 102 of method 100 is to apply a lower photoresist layer over the surface of the substrate. The lower layer of photoresist is preferably a chemical vapor deposition photoresist which responds to exposure at a given wavelength, denoted herein as a second wavelength. An acceptable resist for use as the lower resist layer is a plasma polymerized polysilane resist as described in Microelectronic Engineering, Vol. 30, 1996, pp. 275–78. The next step 104 of method 100 is to apply an upper layer of photoresist over the lower layer of photoresist.

The upper and lower resist layers may each be positive tone, negative tone, or hybrid resists. The lower resist layer and the upper resist layer should be selected so as to avoid intermixing between the layers. In the example described in the conjunction with preferred embodiment, the CVD polysilane resist used for the lower resist layer is composed of a silicon network similar to polysilicon. This polysilane resist is insoluble to the solvents commonly used for spin-applied photoresists, thereby minimizing mixing of resist layers and degradation of resolution and image profile as the upper resist layer is spin cast over the lower layer. Other resists which could be particularly appropriate for use as the lower resist layer are positive tone water soluble resists such as those described by J. M. Havard, J. M. Frechet, C. G. Wilson et al in SPIE Vol. 3049, pp. 437–47, 1997. Specifically, the materials outlined in Scheme 2 and Scheme 4 in this paper would be suitable as lower resist layers. These resists could be formulated as DUV materials and used with an I-line upper resist layer. These resists are particularly attractive for use in conjunction with the present invention. Their cross-linking after a post-application bake will inhibit mixing. The water process used to develop them will not alter an image in most resists likely to be used for the upper resist layer, and their water insolubility prior to exposure will prevent them from being degraded during the development of the upper resist layer.

The upper photoresist layer may be a conventional I-line or DUV single layer resist. The lower resist should preferably have a differentiation in its developer relative to the upper resist, so that an image developed in the upper resist layer will not be attacked when the lower resist is developed. For example, the polysilane resist (described above) which may be used for the lower resist uses buffered hydrogen flouride (HF), HF vapor, or a flourine plasma for development as a positive tone resist, and may be developed as a negative tone resist using chlorine plasma. If a DUV or I-line resist is used as the upper resist layer, the upper resist layer will not be very sensitive to either the HP or chlorine plasma used to develop the lower resist layer. Meanwhile, most DUV and I-line resists are developed using an aqueous based solution, such as tetramethyl ammonium hydroxide (TMAH) at 0.14 to 0.26 N. The polysilane resist which may be used for the lower resist layer is not affected by aqueous developers. Further, the lower resist layer should preferably be sensitive to an exposure wavelength at which the upper resist layer is opaque. For example, the upper photoresist layer may be a deep ultra-violet (DUV) photoresist. Most DUV photoresists are opaque at an exposure wavelength of 193 nanometers. Most I-line resists, which may also be used as the upper resist layer, are opaque to DUV exposures and 193 nanometer exposures. One skilled in the art will realize that different combinations of resist layers may be used in accordance with the present invention.

It may also be beneficial to use an anti-reflective coating between the lower resist layer and the upper resist layer. If used, an anti-reflective coating would absorb light passing through the upper photoresist layer, preventing the exposure of the lower photoresist layer. The use of an anti-reflective coating is one way to allow the lower photoresist layer and the upper photoresist layer to be selected to respond to the same wavelength of light. However, at least portions of an anti-reflective coating would have to be removed in order to expose the lower photoresist layer.

A substrate portion 200 having a lower photoresist layer 205 and an upper photoresist layer 210 is illustrated in FIG. 2. A silicon dioxide layer 215 or similar dielectric layer underlies the lower photoresist layer 205. Beneath the silicon dioxide layer 215 is a silicon substrate 217. Resists other than those described above may be used in accordance with the invention, but if no anti-reflective coating is used the resists used may be selected so that the lower resist layer 205 responds to a significantly different wavelength of light than the upper resist layer 210. In this way, the exposure of the upper resist layer 210 will not affect the lower resist 205, and vice-a-versa. Additionally, the upper resist layer 210 and the lower resist layer 205 should preferably use different developers, so that the development of one layer will not affect the other layer. In accordance with the preferred embodiment, the lower resist is a CVD polysilane resist that can be developed with a buffered HF solution, HF vapor or a flourine plasma. While a buffered HF solution is an acceptable developer, a buffered HF solution has been known to cause adhesion problems with some resists that may be used as the upper resist layer. These problems may be avoided by using HF vapor as the developer. The upper resist layer may be relatively opaque to light of the second wavelength, to which the lower resist layer responds. The upper resist layer may, for instance, be a conventional resist that may be developed using an aqueous base solution, such as tetramethyl ammonium hydroxide (for example, 0.26 N), potassium hydroxide, or sodium metasilicate, among others.

In this example, the upper resist layer will not develop in a buffered HF solution, and the lower resist will not develop in an aqueous base. The chlorine plasma develop is a directional RIE, and this relaxes the need for the upper resist to act as an optical mask. As shall be seen, however, both the lower resist layer 205 and the upper resist layer 210 will preferably respond to the same etching process and chemicals.

A factor which allows the polysilane resist to be used as the lower resist layer in conjunction with the same exposure wavelength for both the upper and lower resist layers is that the polysilane resist must react with atmospheric oxygen to form an image. The exposed polysilane reacts with oxygen to form silicon dioxide. The chlorine plasma development removes the polysilane and leaves the silicon dioxide. If oxygen cannot reach the polysilane resist, no image can form. The upper resist layer at least partially prevents oxygen from accessing the lower resist layer. Another factor which allows the polysilane resist to be used as the lower resist layer in conjunction with the same exposure wavelength for both the upper and lower resist layers is that the chlorine plasma RIE develop process for the polysilane is directional, and even if the upper resist does not act as an optical mask, it can also act as a physical mask during the RIE develop process. Thus, an image may not form in the polysilane lower resist layer where the upper resist layer is intact, but may form where the upper resist layer has been removed.

It is sometimes desirable to use the same exposure wavelength for both resist layers, as this requires only one exposure tool. The polysilane resist is particularly useful because it allows the same exposure wavelength to be used for both the upper and lower resist layers. It is to be appreciated, however, that other resists may be used in accordance with the invention.

Returning now to FIG. 1, the next step 106 of method 100 is to mask and expose the surface through a first mask having a first exposure pattern using a first wavelength that does not affect the lower resist layer. This first exposure pattern will define the wires which will be formed in the dielectric. According to the preferred embodiment the exposure is done using conventional I-line or DUV exposure tools. These exposure tools typically utilize wavelengths of 248 or 365 nanometers. While the polysilane photoresist used for the lower resist layer in accordance with the preferred embodiment is slightly sensitive at 248 nanometers, it is approximately three times slower than most DUV resists, such as those that may be used as the upper resist layer. Because of this low sensitivity, an exposure of the upper resist layer at 248 nanometers will not substantially degrade the lower resist layer when it comprises a polysilane resist. Of course, other exposure tools, such as x-rays, may be used in accordance with the invention. Because the lower resist layer 205 does not respond to the first wavelength, the lower resist layer 205 is unaffected by the exposure. The next step 108 of method 100 is to develop the upper resist layer. After development the lines exposed in the upper resist layer 210 become openings that allow light to reach the lower resist layer 205, while the unexposed portion of the upper resist layer 210 prevents light from reaching the lower resist layer 205. Thus, the lower resist layer 205 may only receive light at the wavelength to which it responds where the upper resist layer 210 was exposed.

Figure 3:
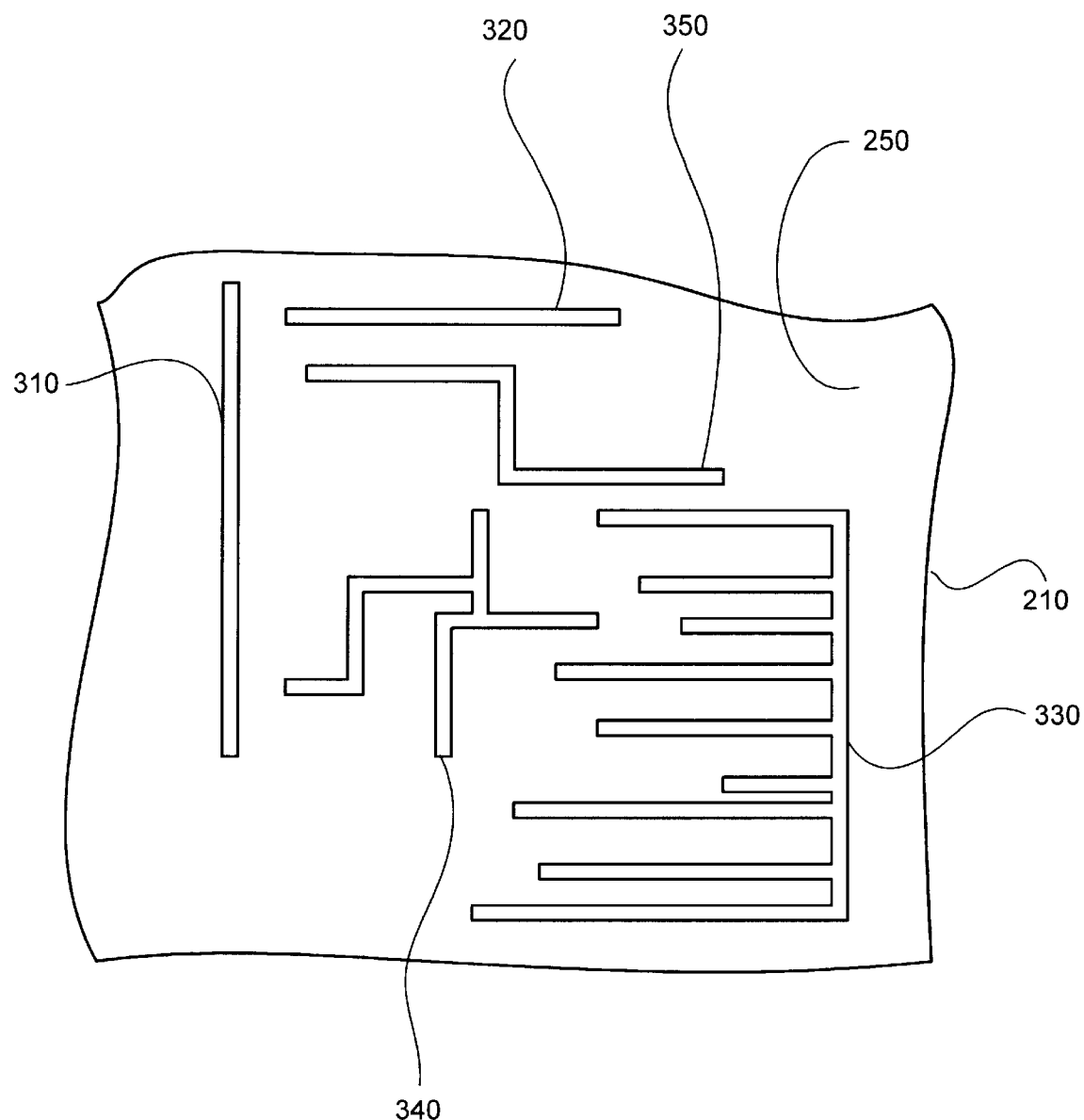
FIG. 3 is a top view of a substrate being processed in accordance with the preferred embodiment.

Turning now to FIG. 3, the upper surface of a substrate portion 200 after step 108 is illustrated. The surface 250 has been exposed at a first wavelength selected for the upper resist layer 210. The first exposure pattern printed on the upper photoresist layer 210 has been developed to create openings. An example exposure pattern and the resulting openings for wafer portion 215 are shown in FIG. 3. Exposing and developing the upper photoresist layer 210 has formed lines 310, 320, 330 and 340 in the upper photoresist layer 210, exposing a portion of the lower photoresist layer 205. As shall be seen, these lines 310, 320, 330 and 340 will be used to define corresponding trenches in the dielectric layer 215, in which wires will be formed.

Returning to FIG. 1, the next step 110 of method 100 is to use a second mask having a second exposure pattern to expose the surface to a second wavelength of light to which the lower resist layer responds. The image printed on the lower photoresist layer will be used to define the interconnects structure, which will extend through the dielectric layer. While an interconnect is typically a square structure, the second exposure pattern may comprise elongated shapes, as the lower photoresist layer can be exposed only at the intersections of the second exposure pattern and the lines printed in the upper photoresist layer. Obviously, the second wavelength used to expose the lower resist layer 205 will depend upon the properties of the lower resist. The optimal wavelength for use with the lower resist layer 208 also depends upon the wavelength used for the upper resist layer 210, as these two wavelengths are preferably sufficiently different to prevent the inadvertent exposure of the lower resist layer 205 when the upper resist layer 210 is exposed. For example, the lower resist layer 205 may be exposed with either a 193 nanometer exposure system (if a 248 or 365 nanometer resist was used for the upper resist layer 210) or a 248 nanometer exposure system (if a 365 nanometer resist was used for the upper resist layer 210).

Because the lower resist layer 205 can be exposed only at the openings where the upper resist layer 210 was exposed, the lower resist layer 205 is exposed only at the portions corresponding to the intersection of the upper photoresist openings and the corresponding openings in the second mask. Thus, only a portion of the exposure pattern contained on the second mask is printed onto the lower resist layer 205.

Figure 4:
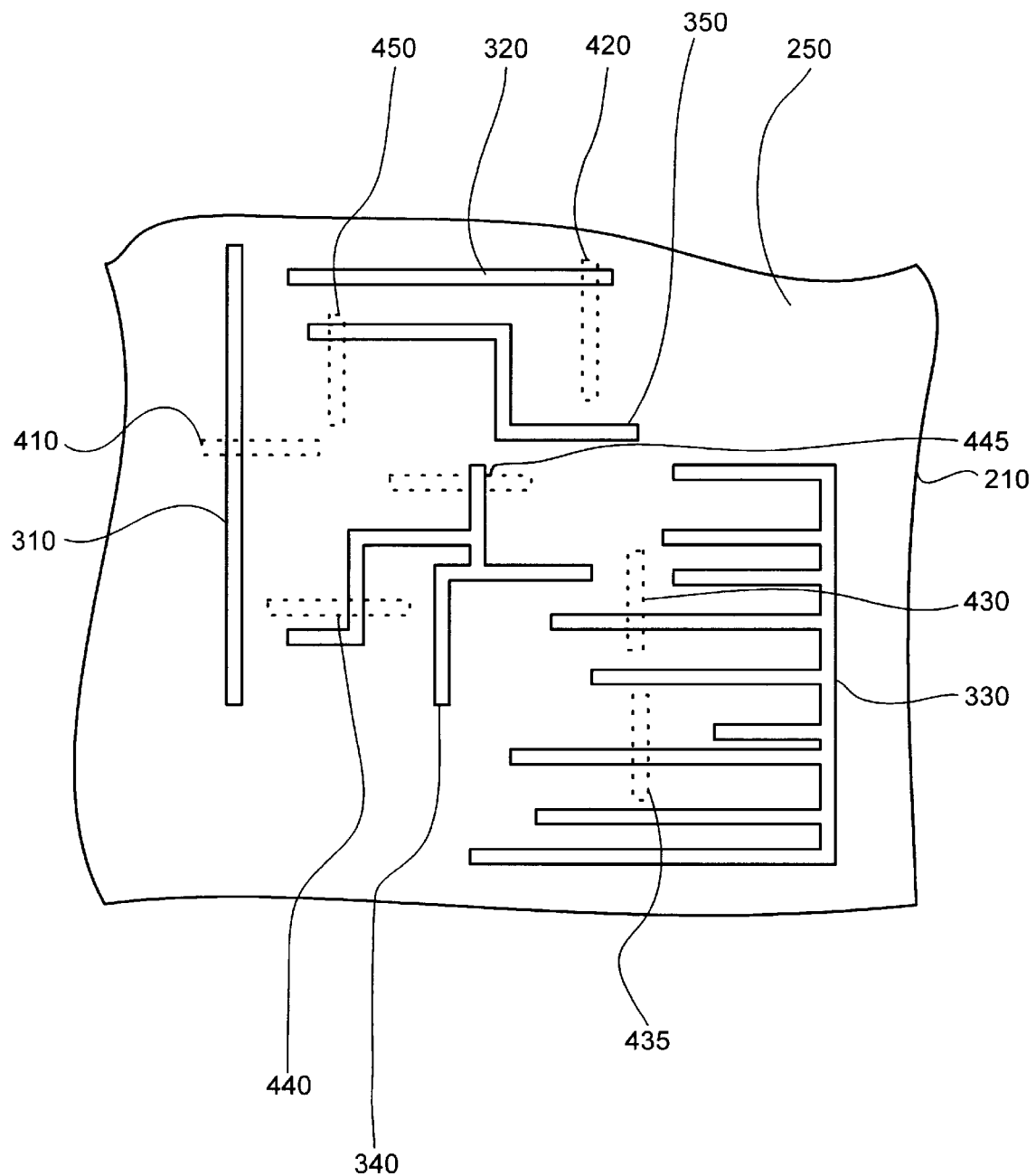
FIG. 4 is a top view of a substrate being processed in accordance with the preferred embodiment.

FIG. 4 illustrates a substrate portion 200 having a lower resist layer 205 and an upper resist layer 210 that has been exposed as described above. The surface 250 is exposed through a second mask having a second exposure pattern at a second wavelength to which the lower resist layer 205 responds. An example second exposure pattern is shown in FIG. 4. The surface 250 is exposed only in regions 410, 420, 430, 435, 440, 445, and 450. As is shown in FIG. 4, the exposed regions 410, 420, 430, 435, 440, 445 and 450 are shaped as elongated rectangles. This shape helps assure an adequate intersection with the 310, 320, 330 and 340 previously exposed and developed in the upper photoresist layer. The second exposure pattern may comprise shapes which allow image enhancement techniques, such as alternating (Levenson) phase shift reticles, off-axis illumination and hybrid resist, to be applied to the second exposure pattern. It is to be recalled at this point that the upper resist layer 210 is relatively opaque to light of the wavelength to which the lower resist layer 205 responds in areas that were previously unexposed. Accordingly, the upper resist layer 210 operates as a mask, causing the lower resist layer 205 to be exposed only in the intersection of the portions where the overlaying upper resist layer 210 has also been exposed, which is at lines 310, 320, 330 and 340, and the regions 410, 420, 430, 440, 445 and 450 of the second exposure pattern. As described in conjunction with the preferred embodiment, the lower resist layer may be a positive tone resist. In this case, the intersection of the second exposure pattern and the developed lines of the upper resist layer will be removed during development. However, the invention may also be practiced using a negative tone or hybrid resist for the lower resist layer. Hybrid resist is described in a pending patent application entitled "Frequency Doubling Hybrid Photoresist", Ser. No. 08/715,287, filed on Sep. 10, 1996 by Hakey et al. and assigned to IBM, as well as a pending application entitled "Optimization of Space Width for Hybrid Photoresist", Ser. No. 09/170,756, filed on Oct. 13, 1998 by Chen et al. and assigned to IBM. The use of the polysilane resist as a negative tone resist allows for the use of the same exposure wavelength for both the upper and the lower resist layers, as was previously described. If a negative tone resist is used as the lower resist layer, the second exposure pattern will contain elongated opaque shapes which will intersect the lines developed in the upper resist layer. If a hybrid resist is used for the lower resist layer, the edges of the elongated shapes of the second exposure pattern will be developed at the intersections with the lines developed in the upper resist layer.

Figure 5:
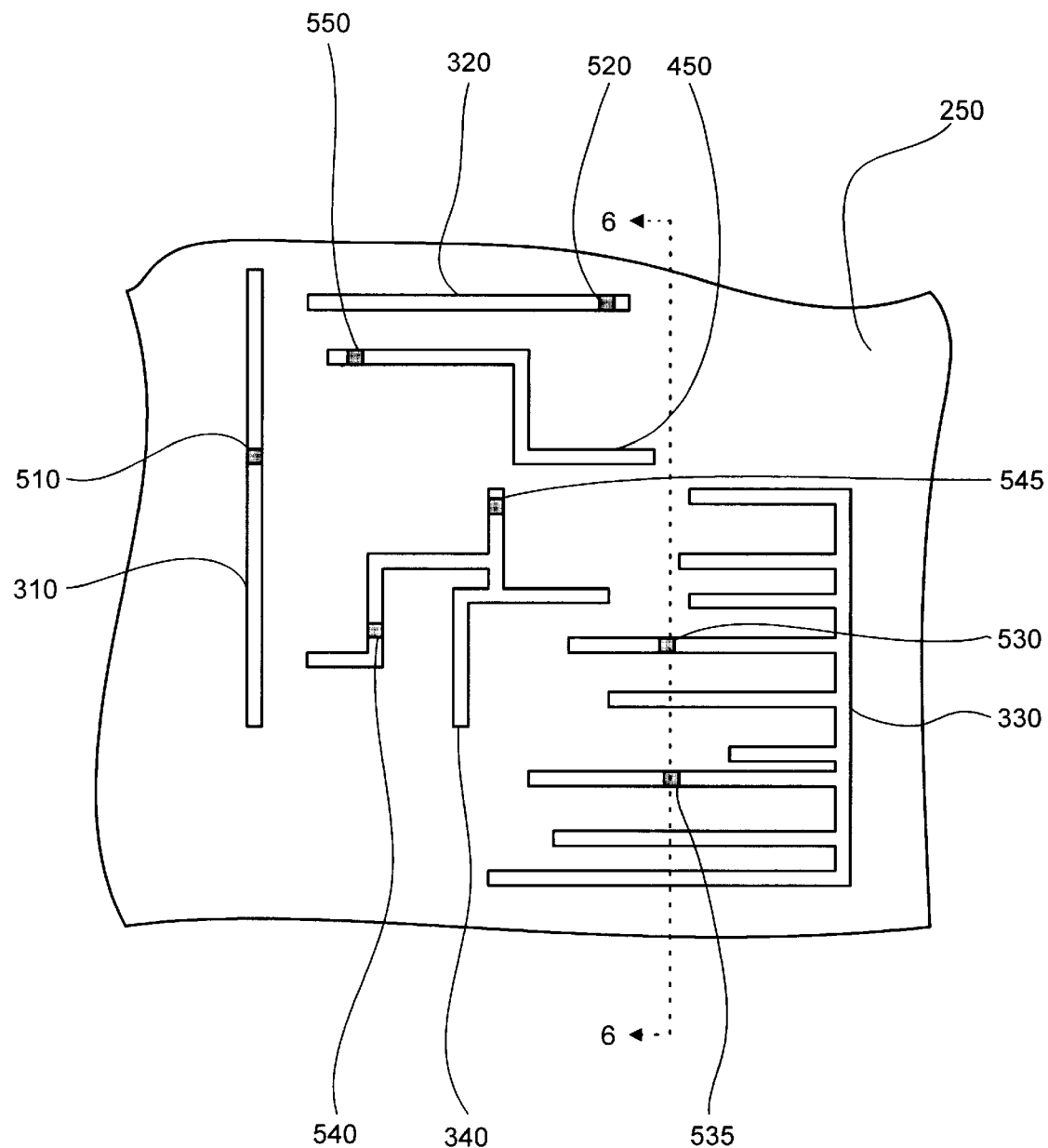
FIG. 5 is a top view of a substrate being processed in accordance with the preferred embodiment.

FIG. 5 illustrates the result of developing the lower resist layer. The lower resist layer 205 was exposed only at the intersections of regions 410, 420, 430, 435, 440, 445 and 450 of the second exposure pattern and the openings of the upper resist layer 210, in this case lines 310, 320, 330, 340 and 350. This results in the lower photoresist layer 205 being exposed only in areas 510, 520, 530, 535, 540, 545 and 550. As is shown in FIG. 5, this results in a very precise self-alignment between the patterns of the vias and trenches, thereby conserving space on the surface 250 of the chip 215.

Figure 6:
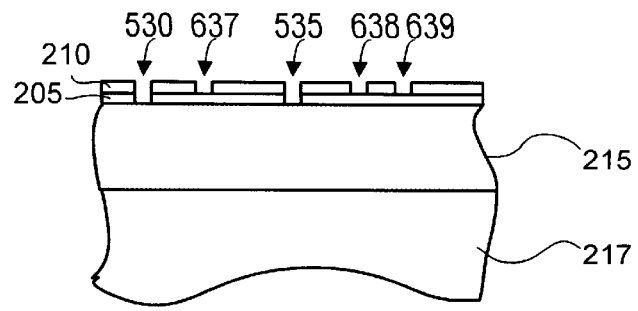
FIG. 6 is a cross-sectional view of a substrate being processed in accordance with the preferred embodiment.

FIG. 6 illustrates a substrate portion after development of the photoresists but before etching. FIG. 6 is a cross-section of the substrate 215 shown in FIG. 5 taken along line 6—6. The upper resist layer 210 has been exposed and developed, and openings have been formed, in locations 630, 635, 637, 638 and 639. The lower resist layer 205 has been exposed and developed, and openings have been formed, on in locations 530, 535.

Referring again to FIG. 1, the next step 114 of method 100 is to etch vias and trenches into the dielectric. According to the preferred embodiment, the depth of the etch is determined by whether one or both layers of resist were exposed at a particular location. If both the upper resist layer 210 and the lower resist layer 205 are exposed and developed in the same location, as is the case for a via, the etch may immediately proceed on the dielectric. If, however, only the upper resist layer 210 has been exposed, as is the case for trenches, the etch must proceed through the lower resist layer 205 before reaching the dielectric. Thus, in an etch of a set time period, the dielectric will be deeply etched at the locations where both resist layers were exposed and developed but only shallowly etched where only the upper resist layer 210 was exposed and developed. In this way, both vias and trenches may be etched in a single step. Of course, one skilled in the art will realize that photoresists that respond to different etchants may be used. While this requires an additional etch step, it allows for independent control of the etch depth of the vias and trenches. In some circumstances, separate etch steps may be desirable. After etching the vias and the trenches, the remaining photoresist should be removed from the surface of the substrate.

Figure 7:
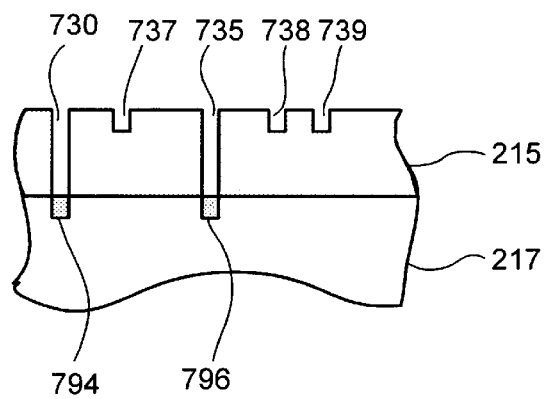
FIG. 7 is a cross-sectional view of a substrate being processed in accordance with the preferred embodiment.

FIG. 7 illustrates a substrate portion after the etching step 1 14 has been performed. Vias 730, 735 have been etched where both the lower resist layer 205 and the upper resist layer 210 were exposed. Trenches 737, 738, 739 have been etched where only the upper resist layer 210 was exposed. The vias 730, 735 extend through the dielectric 215 to the silicon layer 217 of the chip. On the silicon layer 217 the vias 730, 735 contact wires 794, 796 on the lower layer 690. This allows for an interconnection between layers of the chip.

Referring again to FIG. 1, the next step 116 of method 100 is to deposit metal over the surface of the chip to fill in the vias and trenches to form wires and interconnects. Typically the metal deposited will be copper, tungsten or aluminum. The final step 118 of method 100 is to remove the excess metal, leaving only wires and interconnects. This can be done using a planarization process.

Figure 8:
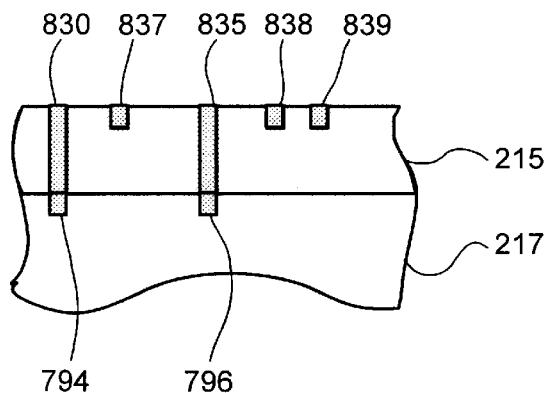
FIG. 8 is a cross-sectional view of a substrate being processed in accordance with the preferred embodiment.

The results of this process are shown in FIG. 8. Interconnections 830, 835 extend through the dielectric 215 to the silicon substrate 217 to contact the wires 794, 796. Wires 837, 838, 839 have been formed in the trenches 737, 738, 739 that were etched in the dielectric 215. Chip fabrication may now continue using any of the various processes used in the art.

In another variation on the preferred embodiment, the upper resist layer is patterned using image enhancement techniques that result in "looped" or "linked" structures. These techniques include phase edge pattern transfer and hybrid resist. Both these techniques have the advantage of improved image resolution but have the disadvantage of resulting in looped image shapes. Because many features need to be formed discretely, these image enhancement techniques cannot be used with separate masking steps to divide the looped images into discrete features. This variation trims the looped features into discrete features to allow these image enhancement techniques to be used without excessive process complexity.

In this variation, a polysilane resist is used as the lower resist layer, and a resist compatible with image enhancement techniques is used as the upper resist layer (e.g., conventional I-line or UV resist, hybrid resist, etc.). Polysilane is preferably used as the lower resist layer for several reasons. First, it does not readily mix with the upper layer resist during application. Second, the plasma develop used for the polysilane resist will not substantially degrade an image in the upper resist. Third, the aqueous base developer used for the upper resist will not substantially degrade the polysilane resist. Fourth, the polysilane resist can function at 193 nm expose, in which the upper resist acts as a mask (when the upper resist is DUV or I-line).

It is preferable that the polysilane resist be used in its negative tone mode, with chlorine plasma being used to remove those areas of resist not exposed. In this case, the polysilane could also be exposed at the same wavelength used for the upper resist, and the chlorine plasma develop process would allow the lower layer resist to be developed only in the regions where it was uncovered by the upper layer, even though the lower layer was exposed in areas both covered and uncovered by the upper layer. With a wet develop resist as the lower layer, any areas exposed with light, even if there were covered with an upper layer of resist, would develop away, causing adhesion failure of the upper resist.

It should be noted in the preferred embodiment, an anti-reflective coating (ARC) is not needed between the upper resist layer and the lower polysilane resist layer. This considerably reduces the process complexity compared to traditional methods.

With the lower and upper resists deposited, the upper resist is exposed using a suitable image enhancement technique. Again, the procedure used will depend upon the technique used. After exposure, the upper resist is developed. Again, because of the image enhancement technique, this will result in a looped trough being formed in the upper resist layer. This reveals a loop of the lower polysilane resist.

The lower resist is then exposed using both a mask reticle and the upper resist to define the areas of the lower resist that are exposed. Preferably, the mask reticle includes shapes that block portions of the loop trough and expose other portions of the loop trough. Thus, areas of the lower resist corresponding to the intersection of the loop trough in the upper resist and non-blocking shapes in the reticle are exposed. Portions of the lower resist blocked by either the upper resist, or a blocking shape in the reticle are unexposed.

The lower resist is then developed using a chlorine plasma or other suitable developer. This removes the unexposed portions of the lower polysilane resist that are not protected by the upper resist. Thus, only those portions of the lower resist corresponding to the intersection of the loop trough and blocking shapes in the second exposure mask reticle are removed. Thus, by using a mask reticle to selectively block portions of the loop trough, discrete troughs in the lower polysilane resist can be formed. These discrete troughs can then be used to form discrete features on the substrate.

Figure 9:
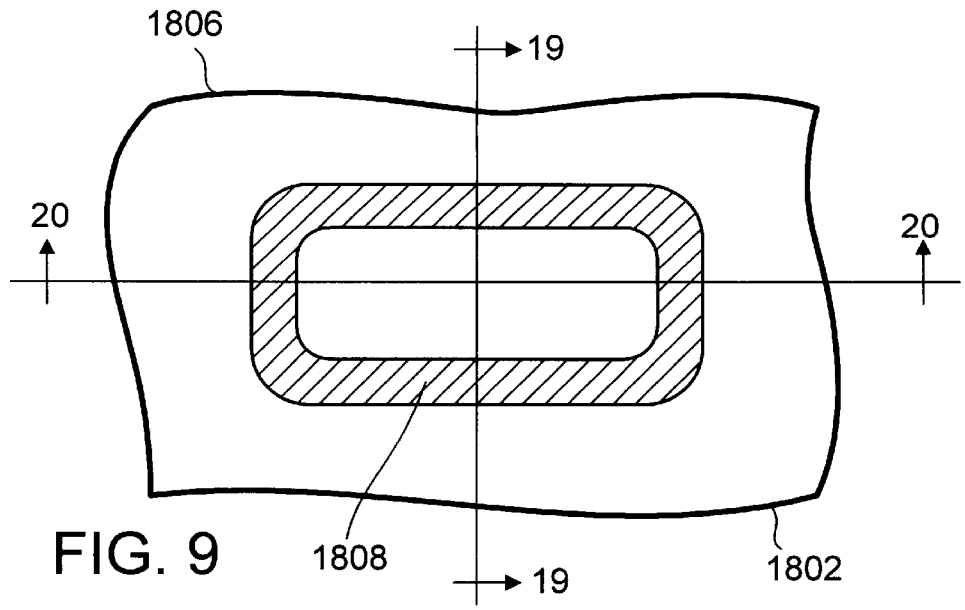
FIG. 9 is a top view of a substrate being processed in accordance with a second exemplary embodiment.
Figure 10:
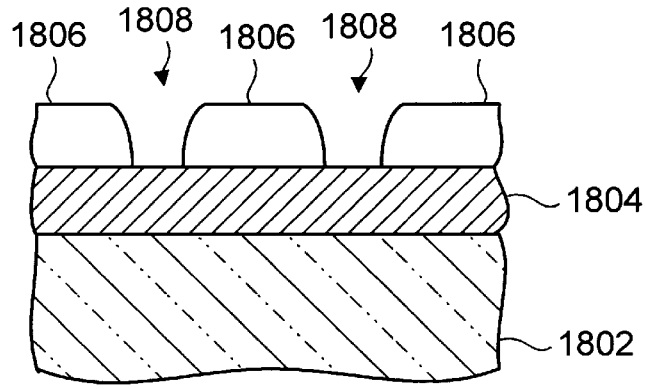
FIG. 10 is a cross-sectional view of a substrate being processed in accordance with a second exemplary embodiment.
Figure 11:
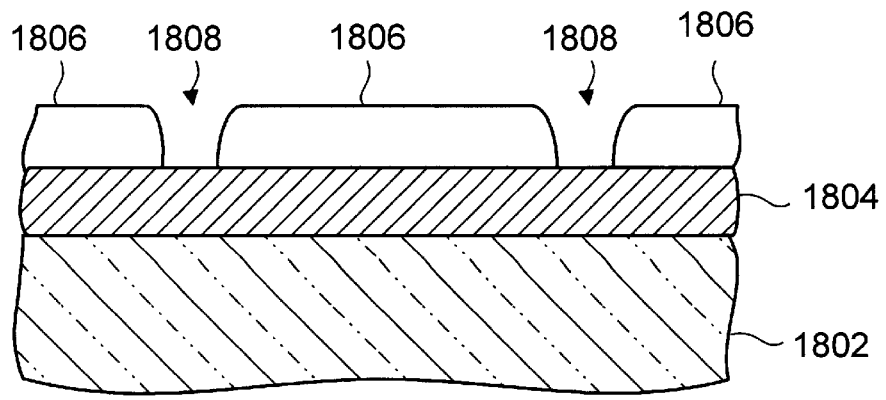
FIG. 11 is a cross-sectional view of a substrate being processed in accordance with a second exemplary embodiment.

Turning now to FIGS. 9, 10, and 11 a looped pattern exemplary of those formed with hybrid resist is illustrated formed over a polysilane resist layer in accordance with this preferred embodiment. In particular, FIGS. 9, 10 and 11 illustrate a patterned hybrid resist layer 1806 and a polysilane resist layer 1804 on a substrate portion 1802, where FIG. 10 is a cross section of the substrate in FIG. 9 taken along lines 19–19, and FIG. 11 is a cross section of the substrate in FIG. 9 taken along lines 20—20. One advantage in using hybrid resist is that troughs 1808 can be printed with a width of less than 0.2 $\mu$m with current deep ultra violet (DUV) lithography tools that are designed for operation at 0.35 $\mu$m resolution. Thus, by using the edge of a mask shape to define troughs 1808 in hybrid resist, smaller dimension features can be created than normal lithography allows. The linking of troughs 1808, while desirable in some applications, such as isolation trench structures, is a problem for other types of features, such as gate conductors or wiring applications. For these applications the linking of troughs 1808 can result in unwanted shorting.

Figure 12:
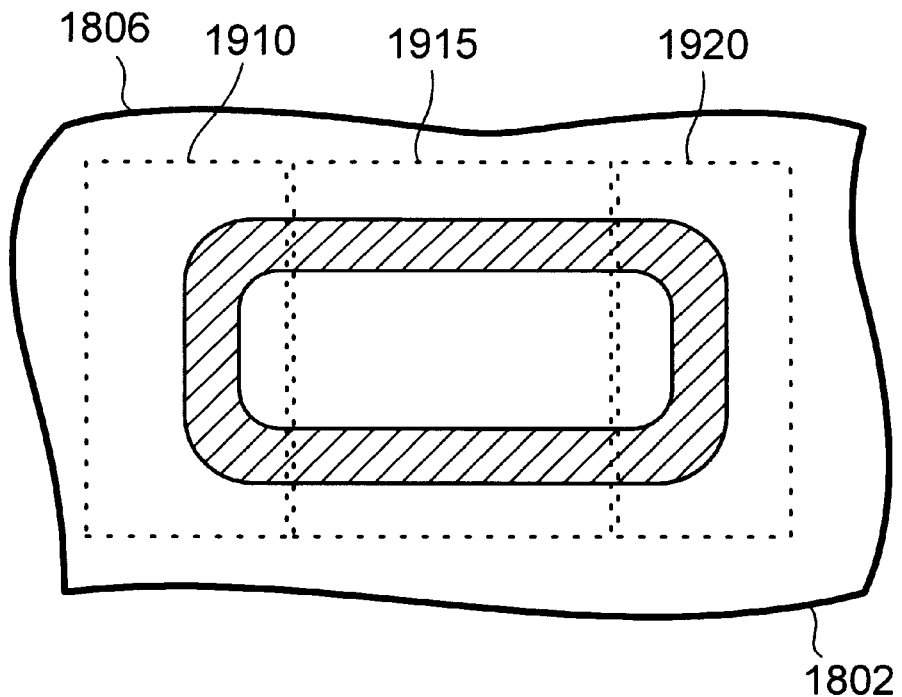
FIG. 12 is a top view of a substrate being processed in accordance with a second exemplary embodiment.

In accordance with this embodiment, the substrate portion is then exposed again through a mask reticle, exposing portions of the linked pattern in the hybrid resist. Turning now to FIG. 12, an exemplary secondary exposure is illustrated where region 1910 and 1920 are exposed, and region 1915 is unexposed. Again, as described with reference to the previous embodiments, this exposure can comprise irradiation with UV light, or an ion implantation. In either case, those portions of the polysilane resist 1804 that are exposed become insoluble in a chlorine plasma developer. Thus, areas of the lower polysilane resist corresponding to the intersection of the troughs 1808 and exposure regions 1910 and 1920 are exposed. Portions of the lower polysilane resist blocked by either the upper resist, or in the unexposed region 1915 are unexposed. The lower polysilane resist is then developed using a chlorine plasma developer. This removes only the unexposed portions not protected by the remaining hybrid resist 1806.

Figure 13:
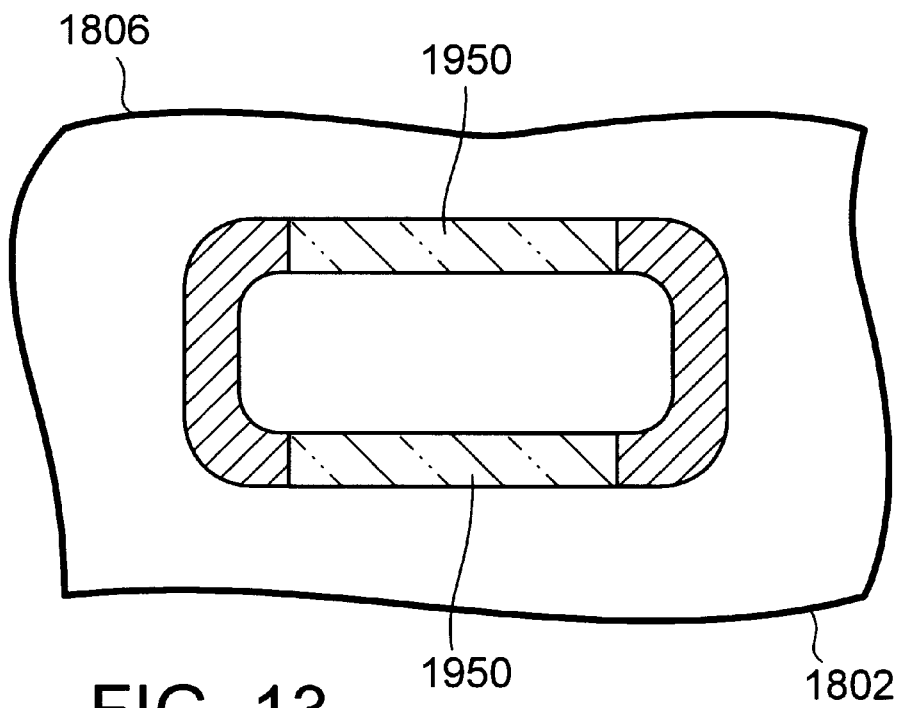
FIG. 13 is top view of a substrate being processed in accordance with a second exemplary embodiment.
Figure 14:
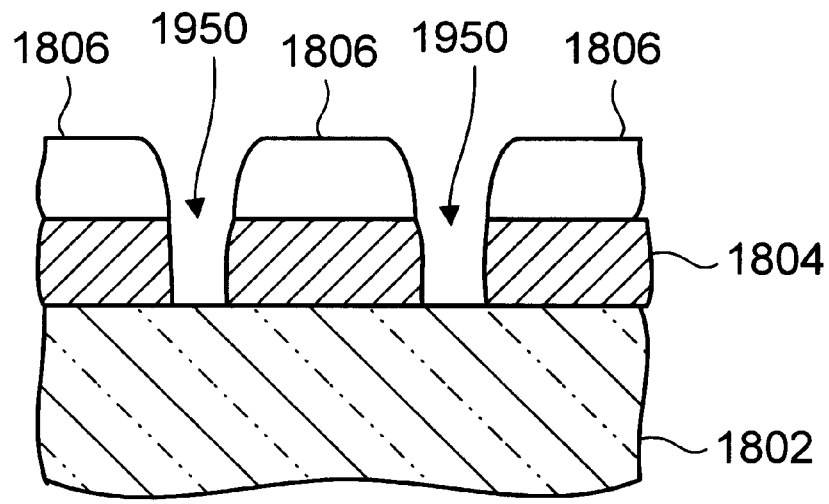
FIG. 14 is a cross-sectional view of a substrate being processed in accordance a second exemplary embodiment.
Figure 15:
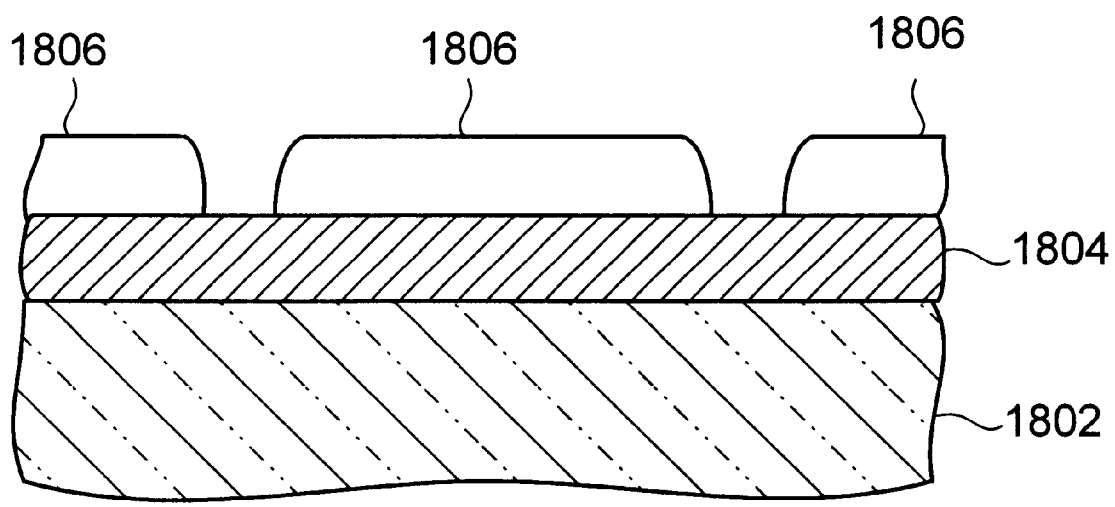
FIG. 15 is a cross-sectional view of a substrate being processed in accordance with a second exemplary embodiment.

Turning now to FIGS. 13, 14 and 15, the substrate portion 1802 is illustrated after the unexposed portions not protected by the remaining hybrid resist 1806 are removed using a chlorine plasma developer. Again, this results in two discrete, unlinked troughs 1950 being formed in the lower polysilane resist. These features can then be used to form discrete features on the substrate portion 1802. It will be recognized by those skilled in the art that this embodiment can be used to define many different types of features, including but not limited to, wiring lines, gate conductors, etc.

While the invention has been described in terms of a preferred embodiment, one skilled in the art will realize that changes may be made without departing from the spirit of the invention. For instance, a wide variety of photoresists may be used. In all likelihood, new photoresists will be developed in the future that will be well suited to the practice of this invention. Different exposure tools and exposure wavelengths other than the examples given herein may be used. Likewise, multiple etch steps may be used, instead of the one etch step performed in the preferred embodiment. Dielectrics other than silicon dioxide may be used to separate chip layers. While the preferred embodiment described contacting interconnects to wires on the silicon substrate level, the present invention may be used to connect any microchip layer to any other layer. Conductors other than aluminum, copper or tungsten may be used for wires or interconnects. The interconnects may even be aligned with components other than wires to electrically connect chip layers.

What is claimed is:

1. A method for defining a feature on a substrate, the method comprising the steps of:
   (A) applying a lower photoresist layer over the substrate;
   (B) applying an upper photoresist layer over the lower photoresist layer;
   (C) exposing the upper photoresist layer through a first mask;
   (D) developing the upper photoresist layer, such that openings are formed in the upper photoresist layer;
   (E) exposing the lower photoresist layer through a second mask and through the upper photoresist openings, such that the portions of the lower photoresist layer corresponding to the intersection of the upper photoresist openings and the corresponding openings in the second mask are exposed;
   (F) developing the lower photoresist layer, such that openings are formed in the lower photoresist layer; and
   (G) forming the feature using the lower photoresist openings.

2. The method of claim 1 wherein the upper photoresist layer is a negative tone photoresist.

3. The method of claim 1 wherein the upper photoresist layer is a positive tone photoresist.

4. The method of claim 1 wherein the upper photoresist layer is a hybrid photoresist.

5. The method of claim 1 wherein the lower photoresist layer is a positive tone photoresist.

6. The method of claim 1 wherein the lower photoresist layer is a negative tone photoresist.

7. The method of claim 1 wherein the lower photoresist layer is a hybrid photoresist.

8. The method of claim 1 wherein the lower photoresist layer is a polysilane photoresist.

9. The method of claim 8 wherein the step of developing the lower photoresist layer comprises performing a directional chlorine plasma etch.

10. The method of claim 9 wherein the step of exposing the upper photoresist layer and the step of exposing the lower photoresist layer use the same exposure tool.

11. The method of claim 1 wherein the lower photoresist layer and the upper photoresist layer respond to light of different wavelengths.

12. The method of claim 1 wherein the translucent portions of the second mask through which the lower photoresist layer is exposed comprise elongated shapes.

13. The method of claim 12 wherein the step of exposing the lower photoresist layer through a second mask further comprises the step of using an alternating phase shift reticle.

14. The method of claim 12 wherein the step of exposing the lower photoresist layer through a second mask further comprises the step of using off-axis illumination.

15. The method of claim 1 wherein the step of applying a lower photoresist layer comprises applying polysilane photoresist, and where the steps of exposing and developing the upper photoresist layer result in looped openings in the upper photoresist layer.

16. The method of claim 15 wherein the upper photoresist layer comprises hybrid resist.

17. The method of claim 15 wherein the step of exposing the upper photoresist layer comprises using a phase shifting exposure.

18. The method of claim 15 wherein the step of developing the lower resist layer forms discrete openings in the lower resist layer corresponding to the intersections of the looped openings in the upper photoresist layer and the exposure pattern of the second mask.

19. The method of claim 15 wherein the step of developing comprises developing with a chlorine plasma and wherein the lower photoresist layer forms discrete openings in the lower photoresist layer corresponding to the intersection of the looped openings in the upper photoresist layer and the areas unexposed during the step of exposing the lower photoresist layer.

20. The method of claim 1, further comprising the step of:
(H) forming a second feature using the upper photoresist openings.

21. A method for creating trenches and vias on a semiconductor substrate, the method comprising the steps of:
(A) applying a lower photoresist layer over the substrate;
(B) applying a upper photoresist layer over the lower photoresist layer;
(C) exposing the upper photoresist layer through a first mask;
(D) developing the upper photoresist layer, such that openings are formed in the upper photoresist layer;
(E) exposing the lower photoresist layer through a second mask and through the upper photoresist openings, such that the portions of the lower photoresist layer corresponding to the intersection of the upper photoresist openings and the corresponding openings in the second mask are exposed;
(F) developing the lower photoresist layer, such that openings are formed in the lower photoresist layer;
(G) forming vias using the lower photoresist openings; and
(H) forming trenches using the upper photoresist openings.

22. The method of claim 21 wherein the upper photoresist layer is a negative tone photoresist.

23. The method of claim 21 wherein the upper photoresist layer is a positive tone photoresist.

24. The method of claim 21 wherein the upper photoresist layer is a hybrid resist.

25. The method of claim 21 wherein the lower photoresist layer is a positive tone photoresist.

26. The method of claim 21 wherein the lower photoresist layer is a negative tone photoresist.

27. The method of claim 21 wherein the lower photoresist layer is hybrid photoresist.

28. The method of claim 21 wherein the lower photoresist layer is a polysilane photoresist.

29. The method of claim 28 wherein the step of exposing the upper photoresist layer and the step of exposing the lower photoresist layer use the same exposure wavelength.

30. The method of claim 29 wherein the step of developing the lower photoresist layer comprises performing a directional chlorine plasma etch.

31. The method of claim 21 wherein the lower photoresist layer and the upper photoresist layer respond to light of different wavelengths.

32. The method of claim 21 wherein the translucent portions of the second mask comprise elongated shapes.

33. The method of claim 21 wherein the step of exposing the lower photoresist layer through the second mask further comprises the step of using an alternating phase shift reticle.

34. The method of claim 21 wherein the step of exposing the lower photoresist layer through the second mask further comprises the step of using off-axis illumination.

35. The method of claim 21 wherein the steps of forming vias using the lower photoresist openings and of forming trenches using the upper photoresist openings comprise a single etch.

36. A method for forming self-aligned wires and interconnects on a semiconductor substrate, the method comprising the steps of:
(A) forming a dielectric layer over the surface of the substrate;
(B) applying a lower photoresist layer over the dielectric layer;
(C) applying an upper photoresist layer over the lower photoresist layer;
(D) patterning the wires by:
(i) exposing the upper photoresist layer to light of a first wavelength to which the upper photoresist layer responds through a first mask having a first exposure pattern, such that only portions of the upper photoresist layer corresponding to the first exposure pattern receive the light of the first wavelength; and
(ii) developing the upper photoresist layer, such that openings are formed in the upper photoresist layer;
(E) patterning the interconnects by:
(i) exposing the lower photoresist layer to light of a second wavelength to which the lower photoresist layer responds through a second mask having a second exposure pattern and through the openings of the upper photoresist layer, such that only the portions of the lower photoresist that underlay an opening of the upper photoresist layer and correspond to the second exposure pattern receive the light of the second wavelength; and
(ii) developing the lower photoresist layer such that openings are formed in the lower photoresist layer where the lower photoresist layer received light of the second wavelength;
(F) etching trenches in the dielectric layer in locations corresponding to the openings in the upper photoresist layer;
(G) etching vias through the dielectric layer in locations corresponding to the openings in the lower photoresist layer;
(H) overfilling the surface of the substrate with a metal, such that the trenches and vias are filled with the metal; and
(I) planarizing the metal such that the metal remains only in the vias and the trenches.

37. The method of claim 36 wherein the upper photoresist layer is a negative tone photoresist and the upper photoresist openings are formed in the portion of the upper photoresist layer that do not receive light of the first wavelength.

38. The method of claim 36 wherein the upper photoresist layer is a positive tone photoresist and the upper photoresist openings are formed in the portions of the upper photoresist layer that receive light of the first wavelength.

39. The method of claim 36 wherein the upper photoresist layer is a hybrid photoresist and the upper photoresist openings are formed at the edges of the portions of the upper photoresist layer that receive light of a first wavelength.

40. The method of claim 36 wherein the lower photoresist layer does not respond to light of the first wavelength.

41. The method of claim 36 wherein the upper photoresist layer does not respond to light of the second wavelength.

42. The method of claim 36 wherein the first wavelength of light is approximately 365 nanometers and the second wavelength of light is approximately 193 nanometers.

43. The method of claim 36 wherein the first wavelength of light is approximately 248 nanometers and the second wavelength of light is approximately 193 nanometers.

44. The method of claim 36 wherein the first wavelength of light is approximately 365 nanometers and the second wavelength of light is approximately 248 nanometers.

45. The method of claim 36 wherein the second exposure pattern comprises a plurality of elongated shapes.

46. The method of claim 45 wherein the step of patterning the interconnects further comprises enhancing the image of the second exposure pattern using an alternating phase shift reticle.

47. The method of claim 45 wherein the step of patterning the interconnects further comprises enhancing the image of the second exposure pattern using off-axis illumination.

48. A method for defining a feature on a substrate, the method comprising the steps of:

(A) applying a lower photoresist layer over the substrate;

(B) applying an upper photoresist layer over the lower photoresist layer;

(C) exposing the upper photoresist layer through a first mask;

(D) developing the upper photoresist layer, such that openings comprising at least one loop are formed in the upper photoresist layer;

(E) exposing the lower photoresist layer through a second mask and the at least one loop of the upper photoresist layer, such that only a portion of the lower photoresist layer underlying the at least one loop is exposed;

(F) developing the lower photoresist layer, such that openings are formed in the lower photoresist layer; and (G) forming the feature using the lower photoresist openings.

49. The method of claim 48 wherein the lower photoresist layer comprises a polysilane photoresist.

50. The method of claim 48 wherein the upper photoresist layer comprises a hybrid resist.

51. The method of claim 48 wherein the step of exposing the upper photoresist layer through a first mask comprises using an alternating phase shift reticle.

52. The method of claim 48 wherein the step of exposing the upper photoresist layer through a first mask using an image enhancement technique comprises using off axis illumination.

53. The method of claim 48 wherein the step of developing comprises developing with a chlorine plasma and wherein the lower photoresist layer forms discrete openings in the lower photoresist layer corresponding to the intersection of the looped openings in the upper photoresist layer and the area unexposed during the step of exposing the lower photoresist layer.

* * * * *